United States Patent
Grupa et al.

(10) Patent No.: US 7,561,405 B1
(45) Date of Patent: Jul. 14, 2009

(54) FEED THROUGH CAPACITOR

(75) Inventors: Timothy M. Grupa, Golden Valley, MN (US); David E. Everett, Blaine, MN (US)

(73) Assignee: Bae Systems Land & Armaments, L.P., Arlington, VA (US)

( * ) Notice: Subject to any disclaimer, the term of this patent is extended or adjusted under 35 U.S.C. 154(b) by 151 days.

(21) Appl. No.: 11/725,576

(22) Filed: Mar. 19, 2007

Related U.S. Application Data

(60) Provisional application No. 60/796,469, filed on May 1, 2006.

(51) Int. Cl.
  *H01G 4/35* (2006.01)
  *H01G 4/38* (2006.01)
  *H03H 7/00* (2006.01)
(52) U.S. Cl. .............. 361/302; 361/328; 333/182
(58) Field of Classification Search .............. 361/302, 361/306.1, 306.2, 308.1, 328, 329; 333/182
See application file for complete search history.

(56) References Cited

U.S. PATENT DOCUMENTS

| | | | |
|---|---|---|---|
| 3,023,383 A * | 2/1962 | Schlicke | ............... 333/182 |
| 3,235,939 A | 2/1966 | Rodriguez et al. | |
| 3,617,930 A * | 11/1971 | Snitzer et al. | ............... 372/20 |
| 4,148,003 A | 4/1979 | Colburn et al. | |
| 4,935,842 A | 6/1990 | Carlson et al. | |
| 4,985,802 A | 1/1991 | Ueno et al. | |
| 5,333,095 A * | 7/1994 | Stevenson et al. | ........... 361/302 |
| 5,650,759 A * | 7/1997 | Hittman et al. | ............ 333/182 |
| 5,686,697 A | 11/1997 | Miller et al. | |
| 5,959,829 A * | 9/1999 | Stevenson et al. | ........... 361/302 |
| 5,978,204 A * | 11/1999 | Stevenson | ................ 361/303 |
| 6,613,979 B1 | 9/2003 | Miller et al. | |
| 6,760,215 B2 | 7/2004 | Devoe | |
| 2004/0012462 A1 * | 1/2004 | Kim | ........................ 333/182 |

OTHER PUBLICATIONS

EPCOS, MKV Power Electronic Capacitors for heavy duty applications, http://web.archive.org/web/20060209061028/http://www.epcos.com/web/generator/Web/Sections/Publications/PDF/MKV,property=Data_en.pdf;/MKV.pdf, Feb. 9, 2006.*

* cited by examiner

*Primary Examiner*—Eric Thomas
*Assistant Examiner*—David M Sinclair
(74) *Attorney, Agent, or Firm*—Patterson, Thuente, Skaar & Christensen, P.A.

(57) ABSTRACT

A feed through capacitor, includes an electrical conductor having a first end being in electrical communication with a second end, the first and second ends being couplable to respective means for conveying electrical energy, a groundable electrically conductive housing enclosing at least a portion of the conductor and being spaced apart from the conductor, and a capacitor bank having at least one capacitor element, the capacitor element being in electrical communication with both the conductor and the housing. A method of forming a feed through capacitor is further included.

15 Claims, 9 Drawing Sheets

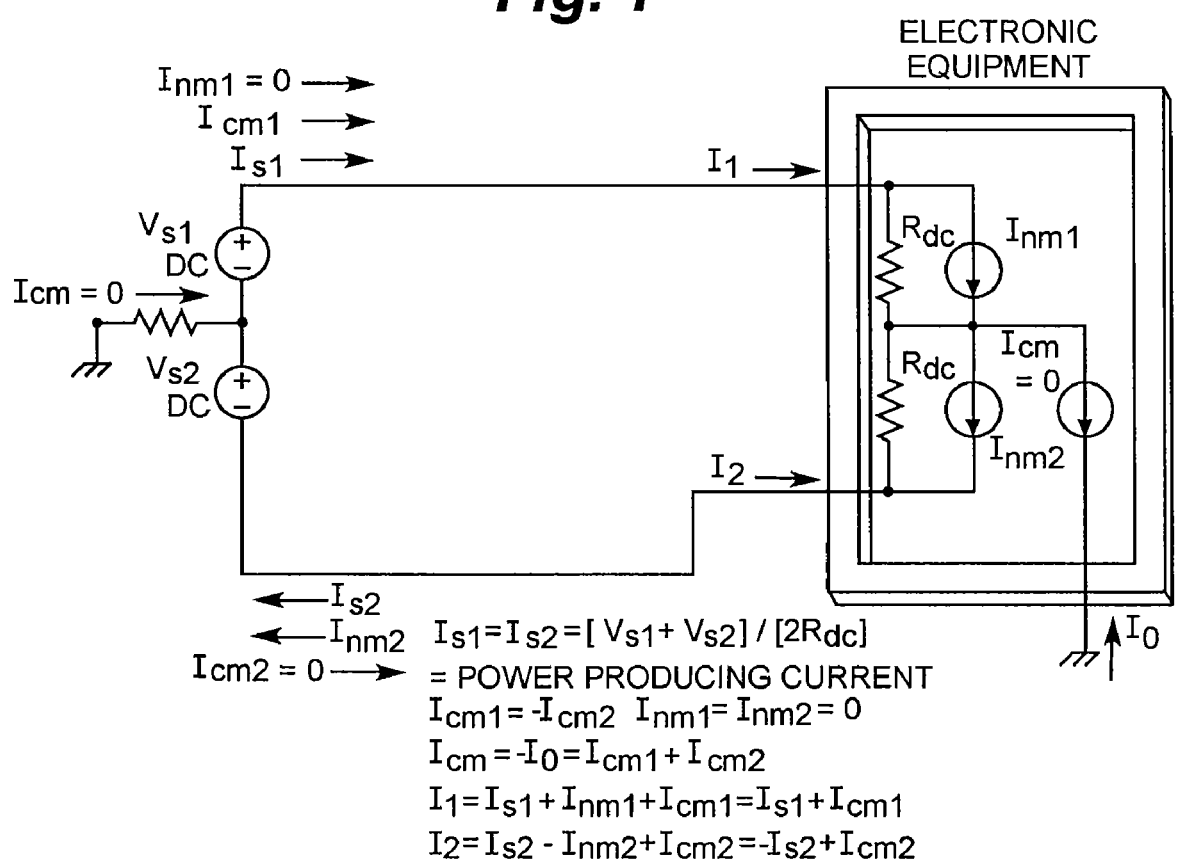

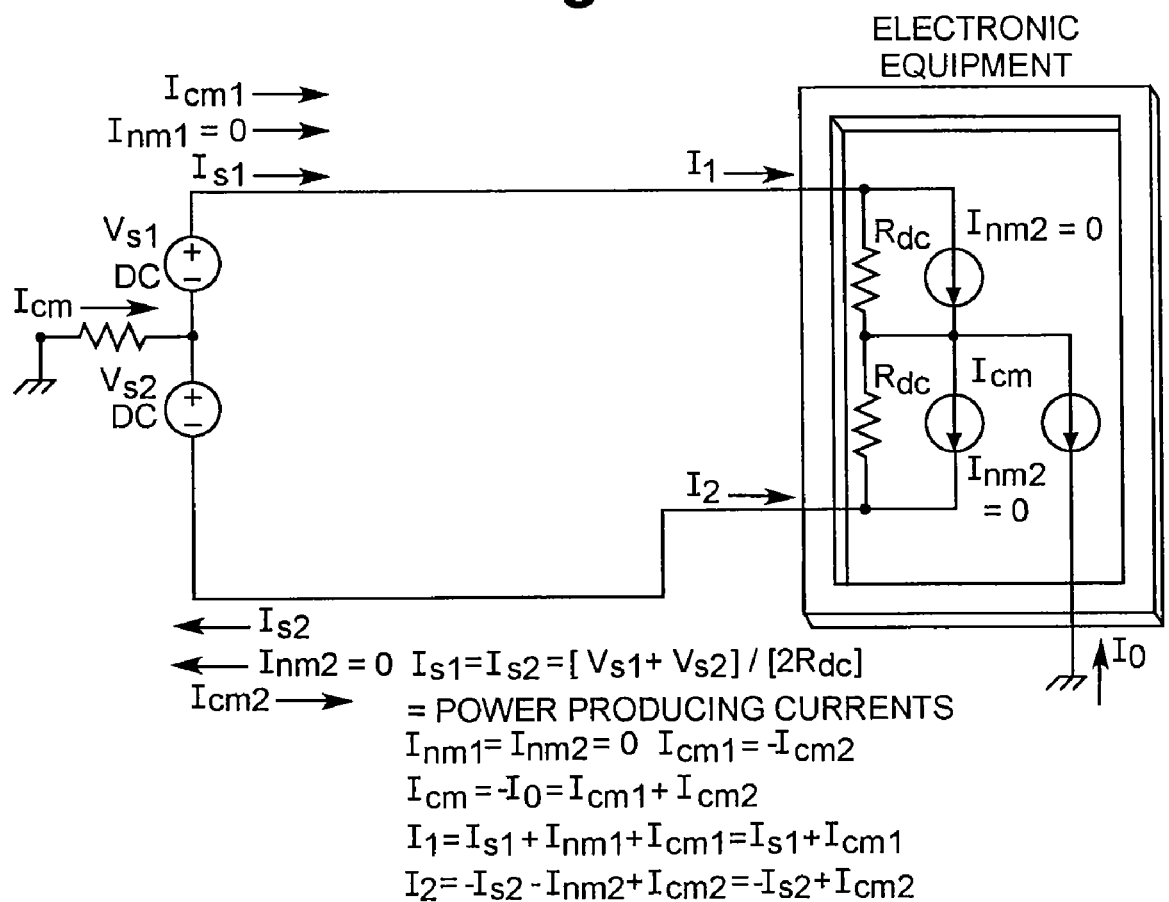

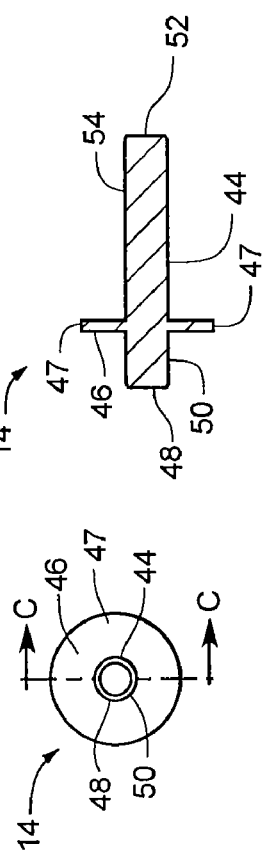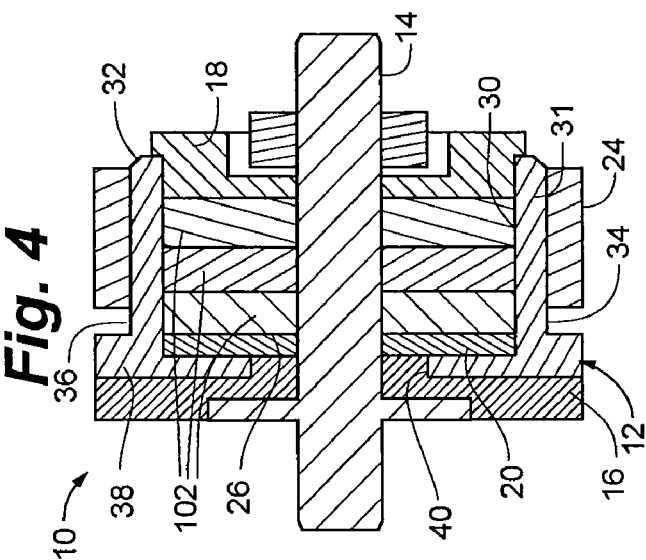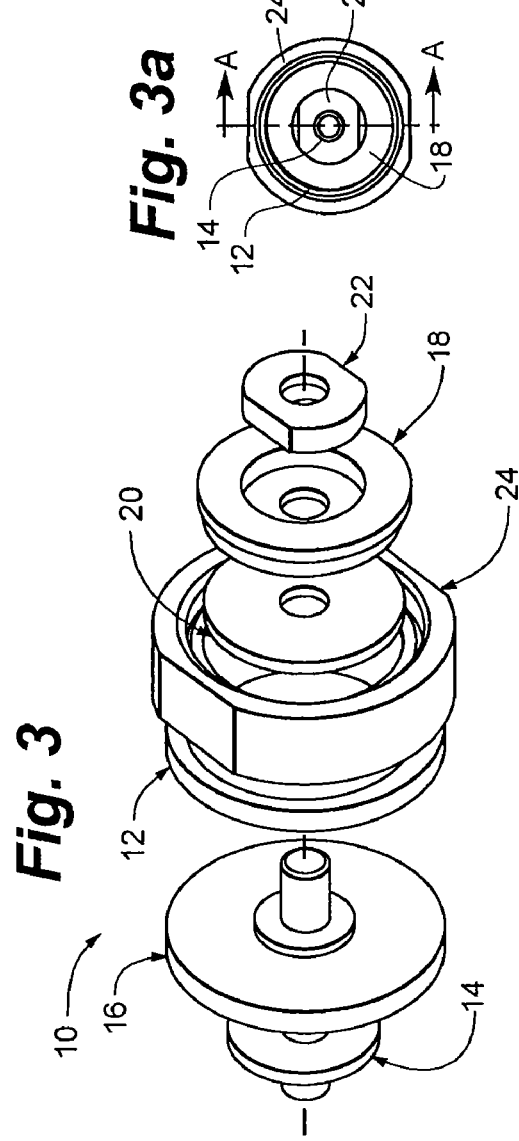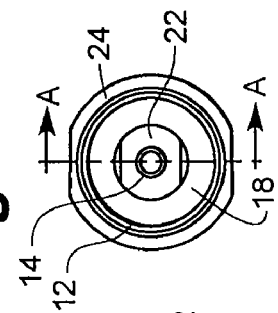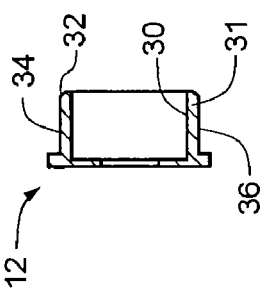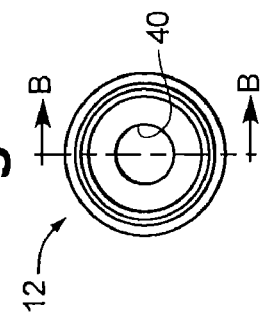

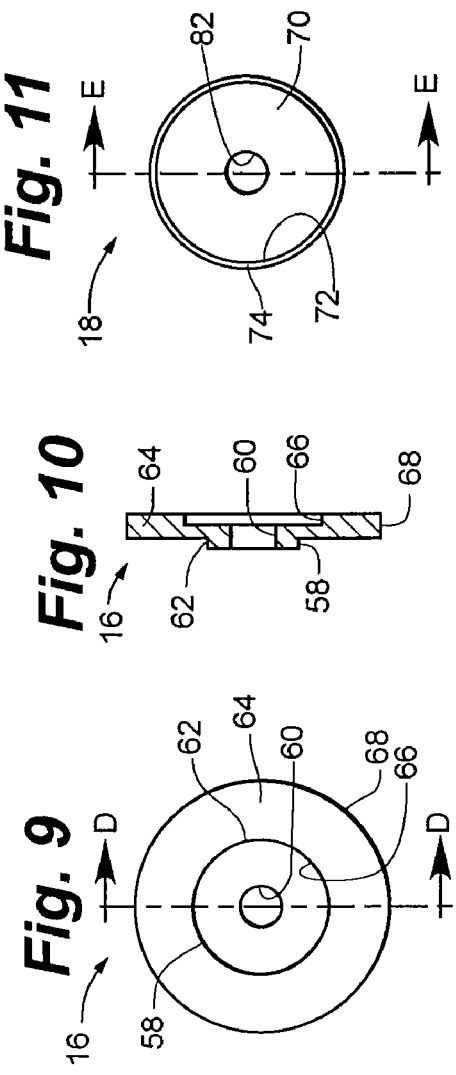

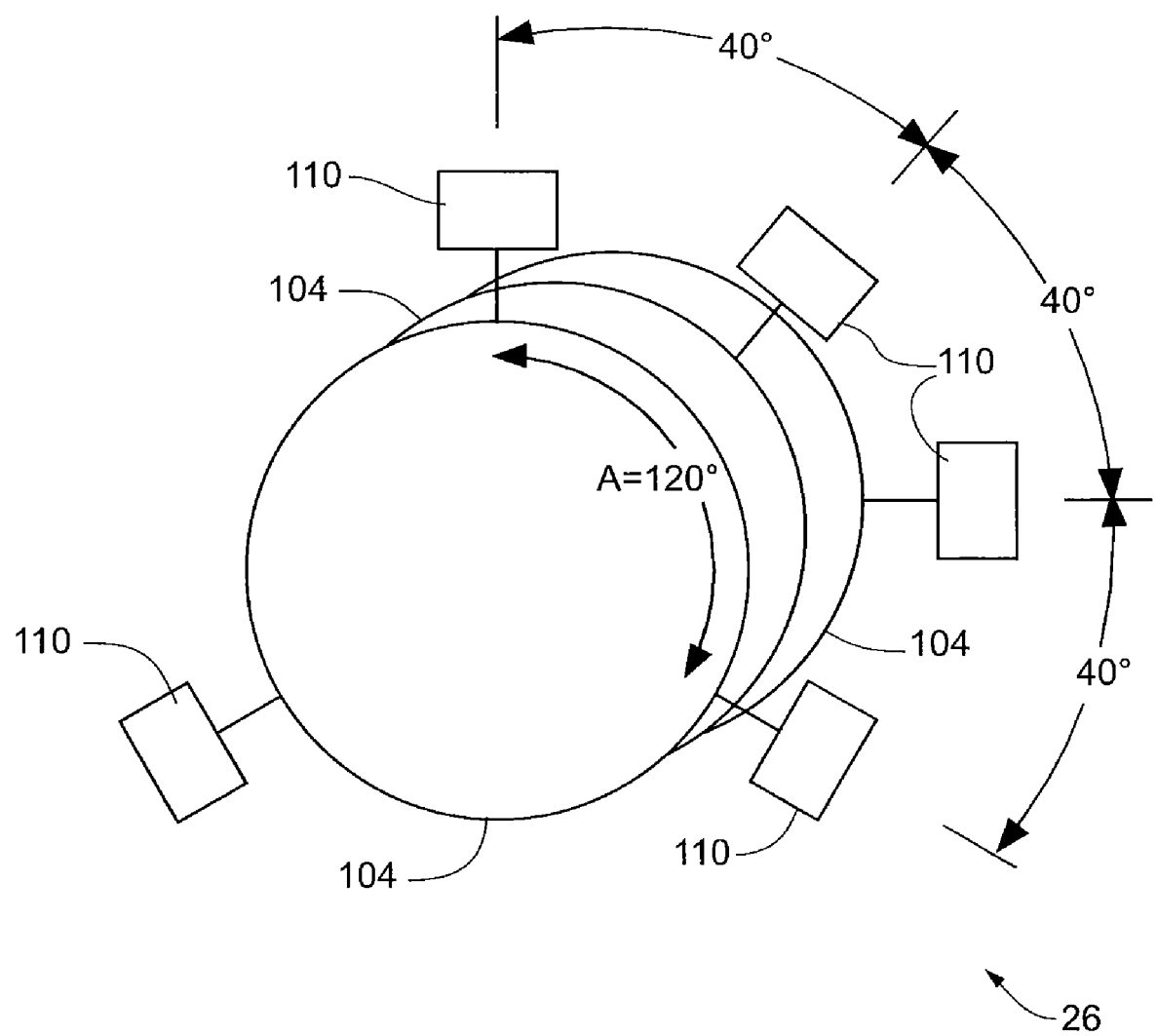

FEED THROUGH CAPACITOR

RELATED APPLICATION

The present application claims the benefit of U.S. Provisional Application Ser. No. 60/796,469, filed May 1, 2006, and which is incorporated herein in its entirety by reference.

TECHNICAL FIELD

The present invention relates to the field of electromagnetic interference. More particularly, the present invention relates to a feed through capacitor (FTC) for filtering electromagnetic interference.

BACKGROUND OF THE INVENTION

Electronic equipment used in commercial and military applications must adhere to conducted emission requirements at the input power terminals of the electronic equipment. These requirements are levied on the electronic equipment manufacturers by agencies such as the FCC, European Union, and, in the case of the U.S. Military, the procuring branch of the service. The goal of these requirements is to minimize the negative interactions that may occur between various pieces of electronic equipment. The negative interactions occur because the noise currents, normally produced by switching action in one piece of electronic equipment, interfere with the proper operation of another piece of electronic equipment. Typically, the method of coupling the negative interactions is conduction through a common shared power bus (DC or AC). Additionally, noise current feeding on the power bus may set up electromagnetic interference that couples into the surrounding electronic equipment via electromagnetic radiation. Noise currents are typically AC and have frequencies that are much higher than the operating frequency of the power source.

In order to meet the conducted emission requirements, inductive components are used in conjunction with capacitors in electrical networks referred to as EMI filters. EMI filters are highly effective in attenuating noise currents that emanate from electronic equipment. Noise currents can be characterized by the path that they take during conduction. Two conduction paths exist: normal mode (sometimes referred to as differential mode) and common mode. See FIGS. 1 and 2 respectively. Normal mode noise currents typically feed into one input power terminal of the electronic equipment and exit from the electronic equipment via the remaining input power terminal (as closed). The sum of all the normal mode noise currents entering and exiting a particular piece of electronic equipment input power terminals is zero. In contrast, the sum of common mode noise currents entering and leaving the electronic equipment input power terminals is not zero. These currents typically find alternate paths through the equipment chassis and the application earth ground structure. These alternate and less predictable paths can be highly disruptive.

In addition to the noise currents that feed into and out of equipment power terminals, power producing currents must also feed. The high frequency noise currents, both normal mode and common mode, essentially modulate the lower frequency power producing component. Power producing currents also feed in the normal mode. Capacitors, used in EMI filters, must efficiently pass the lower frequency power producing component and attenuate the high frequency noise currents.

Common mode noise currents typically occur when energy from the switching transition within the electronic equipment capacitively couples into the equipment ground structure or system ground structure. The magnitude of the common mode noise current is proportional to the parasitic capacitor magnitude and the time/rate of change of the voltage across the parasitic capacitance. Accordingly, a large voltage swing, and a fast switching transition results in a large common mode current magnitude. The duration of the common mode current pulse is proportional to the duration of the electronic equipment switching transitions. The frequency spectrum for the common mode noise currents is often discrete since the switching transitions are usually periodic. The fundamental component of the frequency spectrum is the same as the switching frequency of the electronic equipment and the harmonics are at multiples of the fundamental frequency. The magnitude of the common mode noise frequency spectrum envelope drops gently, starting at the fundamental frequency, to its first null, which in an ideal system is equivalent to the inverse of the switching transition time. This frequency spectrum, with its large energy content at the higher frequencies, can be quite disruptive if mitigation techniques, such as EMI filters, are not employed.

The nature of the common mode frequency spectrum places performance constraints on an FTC that is used as an EMI filter. The FTC must provide a low impedance path to chassis ground for common mode noise current. The low impedance path must be across the entire common mode noise frequency spectrum. The impedance exhibited by the FTC to chassis ground must be lesser than the common mode noise source impedance and the impedance of the load circuit to chassis ground. These performance constraints translate into requirements for the electrical elements of the FTC including capacitance, equivalent series inductance (ESL) and equivalent series resistance (ESR). The FTC capacitance value must be large enough to shunt the low frequency fundamental common mode spectral component. Additionally, the FTC must exhibit a low ESL, enabling it to effectively shunt the higher frequency common mode spectral components. Finally, the ESR of the FTC must be low, enabling it to effectively shunt all common mode spectral components.

FTC's used in high current applications must pass the power source current without introducing power loses. Additionally, FTC's need to provide a low impedance thermal path to the surrounding environment (air or chassis), for power losses that do occur within the FTC. Failure to minimize power losses or provide a low impedance thermal path will result in excessive FTC operating temperature which will reduce the FTC reliability. Excessive power losses within the FTC can also impact the operation of the application circuit by reducing the available circuit input voltage or by contributing to a temperature rise in the application circuitry. These requirements drive the FTC design to maximize cross-sectional conductor area and minimize the length of the FTC conducting element.

FTC's used in high voltage applications must also support the high voltage without breaking down. This requirement places constraints on the insulating materials used in the construction of the capacitor. Additionally, when insulating material cannot be employed, the FTC design must rely on clearance and creepage distances to avoid voltage breakdown. Clearance is the minimum distance required to avoid breakdown (through air) for a given potential. Creepage is the minimum distance required to avoid breakdown (over an insulating surface) for a given potential and insulating material. Clearance and creepage distances become important design requirements at the FTC terminations and dictate the physical size of the capacitor design.

When these low impedance, high current requirements and high voltage requirements are impressed on prior art FTC's, a costly, bulky design results. In addition, the prior art FTC becomes difficult to produce which results in excessive lead time and integration risk. There is a need then in the industry for cost effective, low lead time FTC's exhibiting low impedance, high current capability and high voltage capability.

Commercial off-the-shelf FTC's available today are targeted for low current and low voltage applications. FTC's capable of exhibiting low impedances over a wide frequency range as would be the case with 0.3 microfarad ceramic capacitor, passing a source current of 200 amps, and of supporting voltages of 1000 volts are not readily available. Even custom FTC's, as distinct from commercial off-the-shelf FTC's, do not support the capacitance requirement or the 200 amp current unless three or more custom FTC's are configured in parallel. Further, current custom FTC's have a clearance and creepage distance of 3.2 mm. For the application noted above, clearance and creepage distances of 5 to 10 mm, depending on the pollution degree environment, are required. Further, present custom FTC's are both expensive and have long lead times for delivery, typically in the realm of 22 weeks or more.

SUMMARY OF THE INVENTION

The present invention substantially meets the aforementioned needs of the industry. The FTC of the present invention meets the following requirements:
1. Capacitance: 0.3 microfarad;
2. Capacitance tolerance: +/−10%;
3. Capacitor technology: ceramic, X7R, SMT;
4. ESL: 2 nH;
5. ESR: 0.1 ohms at the resonant frequency;
6. Minimum resident frequency: 7 MHz;
7. Current rating: 200 A with internal hot spot temperature rise less than 35° C.;
8. DC resistance: 0.000125 ohms;
9. Voltage rating: 1000 V;
10. Insulating resistance: 10 Mohm;
11. Dielectric withstand voltage: 2000 V;
12. Ambient operating temperature: −55° C. to 100° C.;
13. Volume: no greater than 36 mm×38 mm×38 mm; and
14. Lead time: no greater than 4 weeks.

The feed through capacitor of the present invention has been designed to meet the aforementioned goals. Testing of devices made in accordance with the present application has shown the feed through capacitor of the present invention to fully meet the aforementioned goals.

The present invention is a feed through capacitor, including an electrical conductor having a first end being in electrical communication with a second end, the first and second ends being couplable to respective means for conveying electrical energy, a groundable electrically conductive housing enclosing at least a portion of the conductor and being spaced apart from the conductor, and a capacitor bank having at least one capacitor element, the capacitor element being in electrical communication with both the conductor and the housing. The present invention is further a method of forming a feed through capacitor.

BRIEF DESCRIPTION OF THE DRAWINGS

FIG. 1 is a schematic depiction of electronic equipment with normal mode AC noise currents;

FIG. 2 is a schematic depiction of electronic equipment with common mode AC noise currents;

FIG. 3 is an exploded view of the feed through capacitor of the present invention;

FIG. 3A is an end elevational view of the assembled FTC taken from the end that includes the internal nut.

FIG. 4 is a sectional view of the FTC taken along the section line A-A of FIG. 3A.

FIG. 5 is an end elevational view of the housing;

FIG. 6 is a sectional view of the housing taken along section line B-B of FIG. 5;

FIG. 7 is an end elevational view of the conductor;

FIG. 8 is a sectional view of the conductor taken along section line C-C of FIG. 7;

FIG. 9 is an elevational view of the flange spacer;

FIG. 10 is a sectional view of the flange spacer taken along section line D-D of FIG. 9;

FIG. 11 is an elevational view of the flanged washer;

FIG. 12 is a sectional view of the flanged washer taken along the section E-E of FIG. 11;

FIG. 13 is an elevational view of the flat washer;

FIG. 14 is a sectional view of flat washer taken along the section line G-G of FIG. 13;

FIG. 15 is a side elevational view of the internal nut;

FIG. 16 is an end elevational view of the internal nut;

FIG. 17 is an end elevational view of the external nut;

FIG. 18 is an elevational view of the external nut taken along section line F-F of FIG. 17;

FIG. 26 is a perspective view of a capacitor bank including three capacitor elements.

DETAILED DESCRIPTION OF THE PREFERRED EMBODIMENTS

Figure 20:
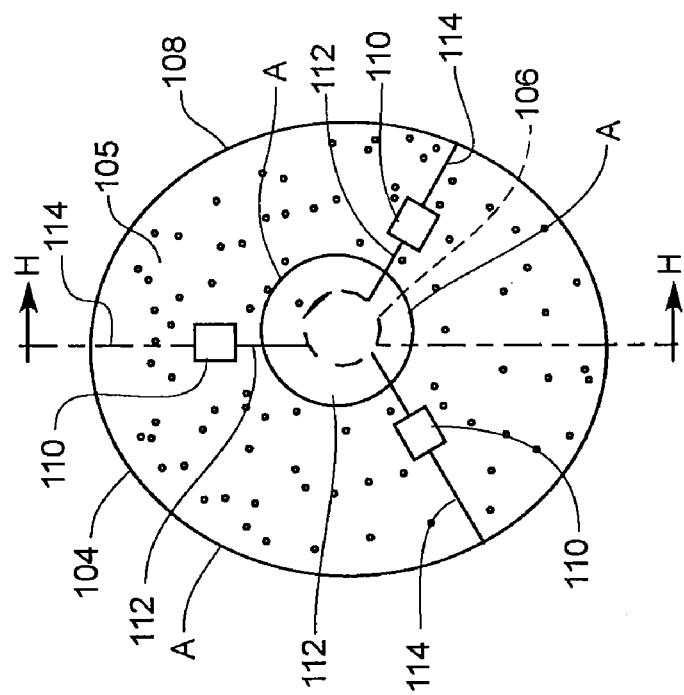
FIG. 20 is a perspective view of a capacitor element.
Figure 19:
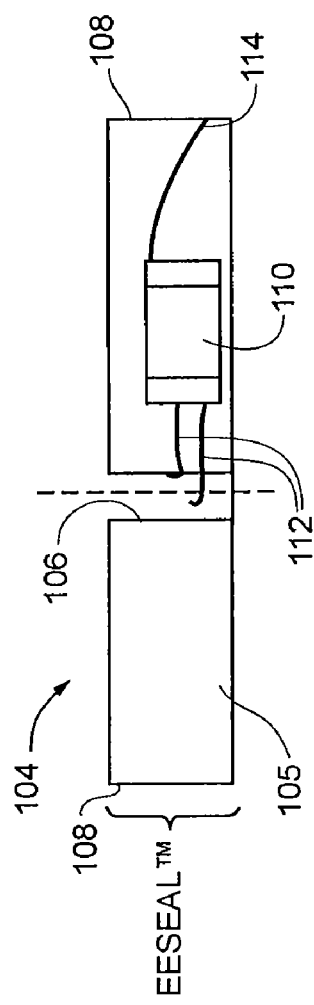
FIG. 19 is a sectional view of a capacitor element taken along the section line H-H of FIG. 20.
Figure 22:
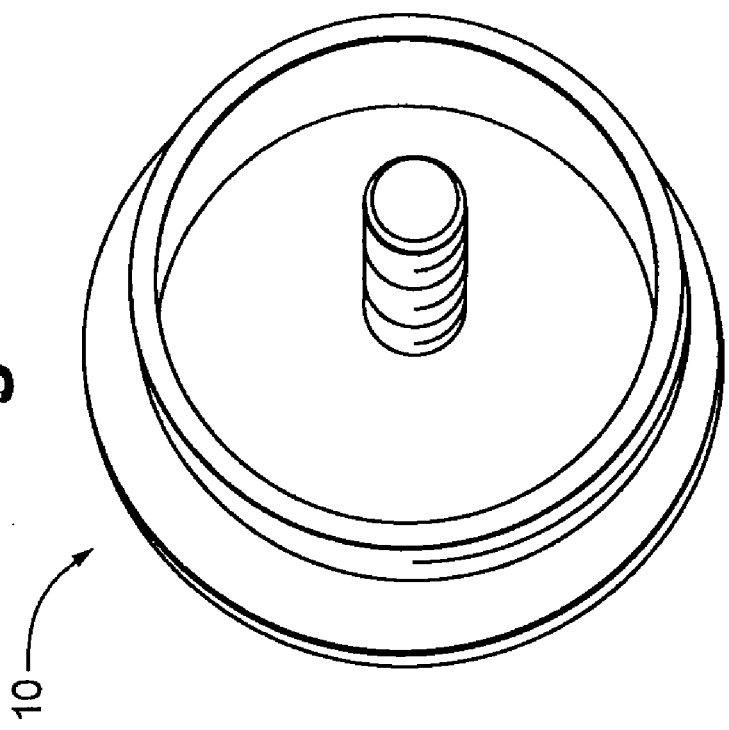
FIG. 22 is a partially assembled feed through capacitor including the threaded contact centered within the housing.

The feed through capacitor of the present invention is shown generally at 10 in the figures. The feed through capacitor (FTC) 10 includes eight components; housing 12, threaded contact 14, flanged spacer 16, flanged washer 18, flat washer 20, internal nut 22, external nut 24, and capacitor bank 26.

Figure 25:
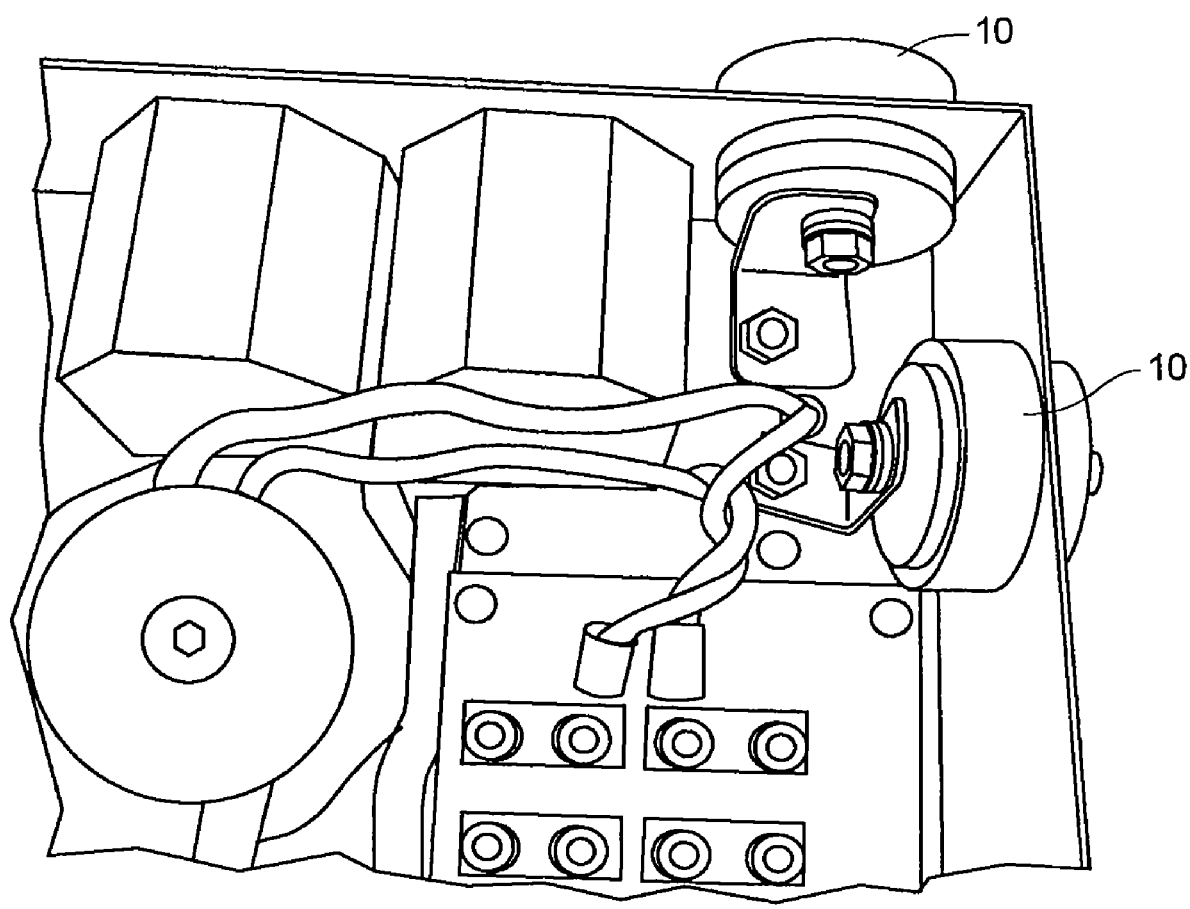
FIG. 25 is a perspective view of a pair of FTC's integrated into an electronic assembly.

Generally, the threaded contact 14 acts as a conductor that provides a path for the power source current. The insulating flanged spacer 16 typically disposed on a first end of the threaded contact 14 centers the threaded contact 14 in the housing 12. The flanged spacer 16 establishes and maintains the required clearance and creepage distances at the first end of the FTC 10. On the opposed second end of the FTC 10, the insulating flanged washer 18 centers the threaded contact 14 in the housing 12 and establishes and maintains the required clearance and creepage distances in cooperation with the flanged spacer 16. Such distances are noted above. The insulating washer 20 provides a flat insulating surface for the capacitor bank 26 (known as an EESEAL). The capacitor bank 26 may include a single EESEAL or a plurality of individual EESEALs. Each EESEAL(s) of the capacitor bank 26 has a bore defined therein, the bore being slid over the threaded contact 14. The EESEAL(s) occupies the space within the housing 12 defined between the spaced apart flanged washer 18 and the flat washer 20. Preferably, one to three EESEALs may occupy this space resulting in capacitance of 0.1 µFd (one EESEAL being employed) to 0.3 µFd (three EESEALs being employed) depending upon the number of EESEALs used. Internal nut 22 is used to compress the EESEAL(s) against the flat washer 20 and against the internal wall of the housing 12. The internal nut 22 also acts as a mounting surface for external electrical terminal lug connections. The flanged surface (described in greater detail below) of the threaded contact 14 acts as a mounting surface for external electrical terminal connections as well. The external nut 24 is used to secure the FTC 10 into the EMI filter assembly, as depicted in FIG. 25.

More particularly, with respect to the structural features of the various components of the FTC 10 as noted above, the housing 12 of the FTC 10 is generally cylindrical in shape having an interior bore 30, as depicted in FIGS. 3-6. The interior bore 30 preferably has a smooth finish. The interior bore 30 is formed as a housing body 31. At a first end of the housing body 31, a beveled edge 32 extends to an outer margin 34. The outer margin 34 is preferably threaded with threads 36.

A flange 38 is formed integral to the housing body 31 at the opposite end of the housing body 31 at which the beveled edge 32 is formed. The flange 38 has a greater diameter than the diameter of the outer margin 34. The flange 38 extends radially inward, partially closing the interior bore 30. A center bore 40 with a diameter that is somewhat less than the diameter of the interior bore 30 is formed in the flange 38, the center bore 40 extending into the interior bore 30.

The second component of the FTC 10, as depicted in FIGS. 3-4, 7 and 8, is the threaded contact 14. The threaded contact 14 has an elongate cylindrical stud body 44. Integral flange 46, having a diameter that is greater than the diameter of the cylindrical stud body 44, is formed on the stud body 44. The integral flange 46 is formed proximate the first end 48 of the stud body 44. Threads 50 are defined on the outer margin of the stud body 44 between the flange 46 and the first end 48. At the opposed second end 52 of the stud body 44, threads 54 are formed on the exterior margin of the stud body 44 extending approximately ⅓ the length of the stud body 44.

The third component of the FTC 10 is the flanged spacer 16. See FIGS. 3-4, 9 and 10. The flanged spacer 16 has a hub 58 with a smoothly finished contact bore 60 defined therein. A step 62 connects the hub 58 to a flange 64. The flange 64 has significantly greater diameter circumferential margin 68 than the diameter exterior margin of the hub 58. The circular recess 66 is defined in the flange 64. A circular recess 66 is preferably concentric with the contract bore 60. Together, the circular recess 66 and the contact bore 60 define a passageway that extends axially through the flanged spacer 16. In a preferred embodiment, the flanged spacer 16 is made of a non-metallic, non-electrically conductive material. Most preferably, the flanged spacer 16 is made of the material commonly known as DELRIN (Polyoxymethylene).

The fourth component of the FTC 10 is the flanged washer 18, as depicted in FIGS. 3-4, 11, and 12. The flanged washer 18 has a washer body 70. The washer body 70 presents a circumferential exterior margin 72. A step 76 leads to a flange 74, the flange 74 presenting a circumferential margin 75 that is lightly greater in diameter than the diameter of the circumferential exterior margin 72. A circular recess 78 is defined in the side of the flanged washer 18 presenting the flange 74. The recess 78 has an inside circumferential margin 80. A contact bore 82 extends through the washer 18 and into the recess 78. Margin 80 has a considerably greater diameter than the diameter of the contact bore 82. In a preferred embodiment, the flanged washer 18 is made of a non-metallic, non-electrically conductive material. Most preferably, the flanged washer 18 is made of the material commonly known as DELRIN (Polyoxymethylene).

The fifth component of the FTC 10 is the flat washer 20. See FIGS. 3-4, 13, and 14. Like the flanged washer 18, the flat washer 20 is preferably made of a non-metallic, non-electrically conductive material and is also most preferably made of the plastic material DELRIN (Polyoxymethylene). The flat washer 20 has a washer body 83. The body 83 defines a circumferential exterior margin 84. The flat washer 20 has a centrally disposed, smooth finished contact bore 86 defined therein.

The sixth component of the FTC 10 is the internal nut 22, depicted in FIGS. 3-4, 15 and 16. The internal nut 22 is comprised of a nut body 87. A portion of the exterior margin is defined by a circumferential exterior margin 88. A pair of opposed flats 90 intersect the circumference defining the circumferential exterior margin 88. A threaded contact bore 92 is centrally, axially defined in the internal nut 22. The width of the internal nut 22 is such that when snugged up against the flanged washer 18, the internal nut 22 resides within the circular recess 78.

The seventh component of the FTC 10 is the external nut 24, depicted in FIGS. 3-4, 17 and 18. The external nut 24 has an interior threaded bore 94. At a first edge of the interior threaded bore 94, a beveled edge 96 is defined. The exterior margin 97 of the external nut 24 is preferably smooth finished and includes a pair of opposed circumferential exterior margins 98 that are joined by a pair of opposed flats 100.

All of the components noted above with the exception of those specifically indicated to be most preferably made of the material DELRIN (Polyoxymethylene) are made of an electrically conductive metal. Preferably, the metal is a brass alloy. Most preferably, the brass alloy is an alloy noted as No. 464, (naval) leadfree.

Figure 21:
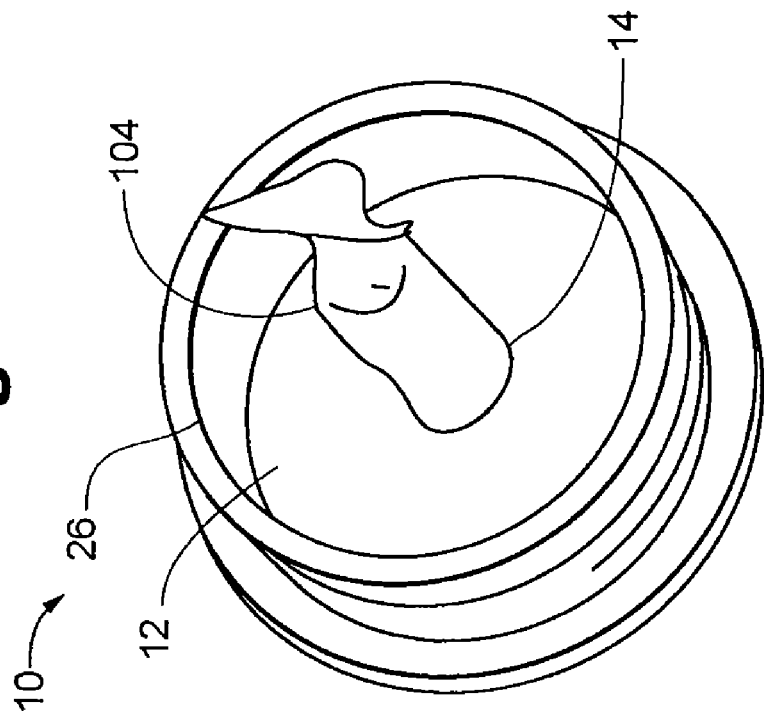
FIG. 21 is a perspective view of a partially assembled FTC with a taped, threaded contact centered within the housing and a capacitor element of the capacitor bank disposed between the threaded contact and the housing.
Figure 24:
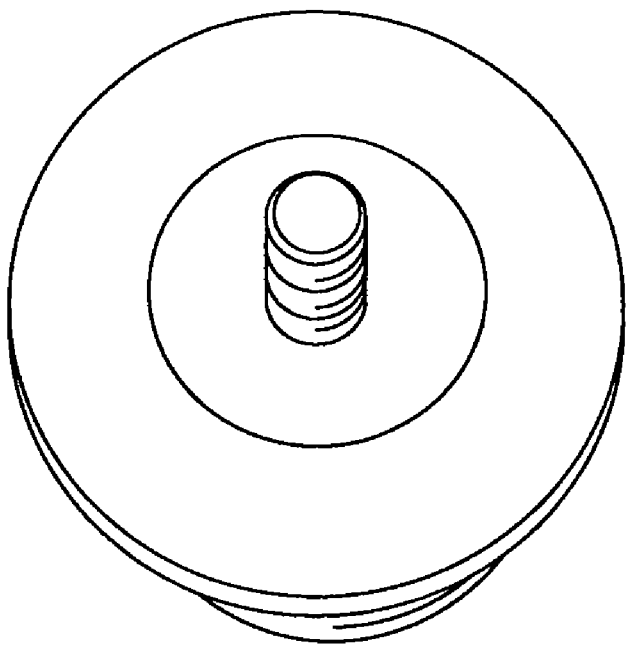
FIG. 24 is a perspective view of a partially assembled feed through capacitor.
Figure 23:
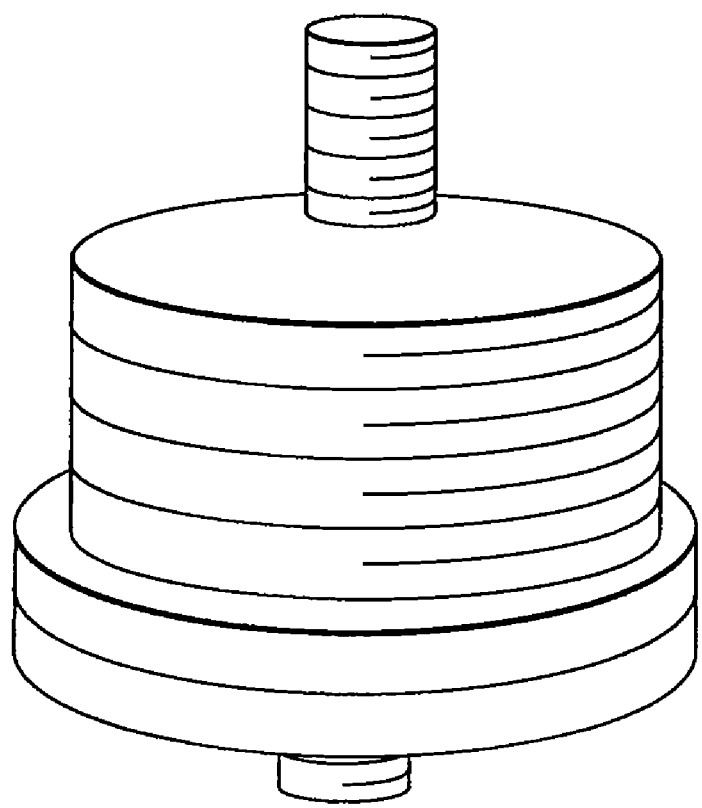
FIG. 23 is a side perspective view of a partially assembled feed through capacitor.

The final component of the FTC 10 is the capacitor bank 26. Preferably, the capacitor bank 26 is an EMI filter insert being a capacitor element(s) 104 known as an EESEAL™, manufactured by Quell Corporation of Albuquerque, N. Mex. 87109. The EESEAL is described in U.S. Pat. Nos. 5,686,697 and 6,613,979, incorporated herein by reference. In general, each EESEAL of the capacitor bank 26 utilizes three 0.033 µFd, 2000 V ceramic surface mount technology capacitors encapsulated within a silicon material, although fewer than three such capacitors are envisioned. The three capacitors are so arranged that they extend outward radially from a center bore defined in the EESEAL. The three capacitors are separated by 120°. When an EESEAL is inserted into the housing 12 (See FIGS. 4 and 21), each of the EESEAL capacitors makes electrical contact with both the housing 12 and the threaded contact 14.

The capacitor bank 26 is best viewed in FIGS. 4, and 19-21. As noted above, the capacitor bank 26 preferably is comprised of three capacitor elements (preferably an EESEAL) 104. Each of the capacitor elements 104 includes a silicon elastomer body 105. A conductor bore 106 is centrally defined within the silicon elastomer body 105. The body 105 presents a circumferential exterior margin 108.

At least one capacitor 110 (FIGS. 19 and 20) is included within the body 105. The capacitor 110 is electrically coupled to conductor contact(s) 112. When the capacitor element 104 is assembled within the housing 12 of the FTC 10, the conductor contact(s) 112 is electrical communication with the threaded contact 14 residing within the conductor bore 106. The capacitor 110 is electrically coupled to the circumferential exterior margin 108 by means of the housing contact 114. When the capacitor element 104 is assembled within the housing 12, the housing contact 114 is electrical communication with the housing 12. Accordingly, there is an electrical path between the threaded contact 14 and the housing 12.

As noted above and shown in FIG. 26, preferably there are three capacitors 110 in each capacitor element 104. The capacitors 110 are preferably spaced equiangularly by the angles A, depicted in FIG. 20. Each of the angles A is 120°. Further, there are preferably three capacitor elements 104 in the capacitor bank 26. When assembled within the housing 12, each of the three capacitor elements 104 is shifted angularly by 40° with respect to the adjacent capacitor element(s) 104. Thus, when the capacitor bank 26 is assembled using three capacitor element(s) 104, there is a capacitor 110 at every successive 40° mark for the full 360° of revolution.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

What is claimed is:

1. A feed through capacitor, comprising:
   an electrical conductor having a first end being in electrical communication with a second end, the first and second ends being couplable to respective means for conveying electrical energy;
   a groundable electrically conductive housing enclosing at least a portion of the conductor and being spaced apart from the conductor; and
   a capacitor bank having three capacitor elements, each capacitor element having three capacitors wherein each of the three capacitors of a capacitor element is spaced 120 degrees relative to adjacent capacitors and a capacitor of any of the three capacitor elements being angularly displaced by forty degrees from a capacitor of both the second capacitor element and the third capacitor element.

2. The feed through capacitor of claim 1 being capable of passing a source current of greater than 100 amperes.

3. The feed through capacitor of claim 1 having a substantially 0.1 to 0.3 microfarad capacitance.

4. The feed through capacitor of claim 3, including at least one capacitor being encapsulated in a silicon material.

5. The feed through capacitor of claim 1 being capable of supporting voltages of greater than 500 volts.

6. The feed through capacitor of claim 1 having a clearance distance of 5-10 mm and a creepage distance of 5-10 mm.

7. The feed through capacitor of claim 1, wherein each of the three capacitors is in electrical communication with a capacitor element inner bore and with a capacitor element outer circumferential margin.

8. The feed through capacitor of claim 1, wherein each of the three capacitors is a 0.033 microfarad, 2000 volt capacitor.

9. The feed through capacitor of claim 1, wherein each of the three capacitors is rotationally disposed 120 degrees relative to adjacent capacitors.

10. A method of forming a feed through capacitor, comprising:
    providing an electrical conductor having a first end being in electrical communication with a second end, the first and second ends being couplable to respective means for conveying electrical energy;
    enclosing at least a portion of the conductor with a groundable electrically conductive housing and spacing the housing apart from the conductor; and
    electrically communicating at least one capacitor element of a capacitor bank with both the conductor and the housing; and
    providing the capacitor bank with three capacitor elements, providing each capacitor element with three capacitors, angularly spacing each of the three capacitors of a capacitor element 120 degrees relative to adjacent capacitors and angularly spacing a capacitor of any of the three capacitor elements forty degrees from a capacitor of both the second capacitor element and the third capacitor element.

11. The method of claim 10 including providing the capacitor bank with a substantially 0.1 to 0.3 microfarad capacitance.

12. The method of claim 10 including supporting voltages of greater than 500 volts by means of the feed through capacitor.

13. The method of claim 10 including providing a clearance distance of 5-10 mm and a creepage distance of 5-10 mm.

14. The method of claim 10, including electrically communicating each of the three capacitors with a capacitor element inner bore and with a capacitor element outer circumferential margin.

15. The method of claim 10, including rotationally disposing each of the three capacitors 120 degrees relative to adjacent capacitors.

* * * * *